United States Patent
Chen et al.

(10) Patent No.: US 8,543,958 B2
(45) Date of Patent: Sep. 24, 2013

(54) OPTICAL PROXIMITY CORRECTION AWARE INTEGRATED CIRCUIT DESIGN OPTIMIZATION

(75) Inventors: Qiang Chen, Cupertino, CA (US); Sridhar Tirumala, Saratoga, CA (US)

(73) Assignee: Synopsys, Inc., Mountain View, CA (US)

( * ) Notice: Subject to any disclaimer, the term of this patent is extended or adjusted under 35 U.S.C. 154(b) by 362 days.

(21) Appl. No.: 12/636,627

(22) Filed: Dec. 11, 2009

(65) Prior Publication Data

US 2011/0140278 A1     Jun. 16, 2011

(51) Int. Cl.
*G06F 17/50* (2006.01)

(52) U.S. Cl.
USPC .......................................... 716/132; 716/139

(58) Field of Classification Search
USPC .......................................... 716/131–135, 139
See application file for complete search history.

(56) References Cited

U.S. PATENT DOCUMENTS

| | | | |
|---|---|---|---|
| 5,872,724 A | 2/1999 | Nakada | |
| 6,230,304 B1 | 5/2001 | Groeneveld et al. | |
| 6,370,679 B1 | 4/2002 | Chang et al. | |
| 6,430,733 B1 | 8/2002 | Cohn et al. | |
| 6,574,786 B1 | 6/2003 | Pohlenz et al. | |
| 6,799,310 B2 | 9/2004 | Miyamoto | |
| 7,032,194 B1 | 4/2006 | Hsueh et al. | |
| 7,039,882 B2 | 5/2006 | Rana et al. | |
| 7,084,464 B2 | 8/2006 | Zounes | |
| 7,095,063 B2 | 8/2006 | Cohn et al. | |
| 7,275,227 B1 * | 9/2007 | Ying | 716/52 |
| 7,356,788 B2 | 4/2008 | Chang et al. | |
| 7,370,314 B2 * | 5/2008 | Minami et al. | 716/53 |
| 7,441,211 B1 | 10/2008 | Gupta et al. | |
| 7,526,741 B2 | 4/2009 | Lee et al. | |
| 7,536,664 B2 * | 5/2009 | Cohn et al. | 716/119 |
| 7,716,612 B1 | 5/2010 | Gupta et al. | |
| 7,926,018 B2 * | 4/2011 | Moroz et al. | 716/132 |
| 2001/0028991 A1 | 10/2001 | Inanami et al. | |
| 2005/0076316 A1 * | 4/2005 | Pierrat et al. | 716/4 |
| 2006/0110837 A1 | 5/2006 | Gupta et al. | |
| 2006/0150132 A1 | 7/2006 | Gupta | |
| 2006/0271902 A1 | 11/2006 | Yamashita et al. | |
| 2007/0033558 A1 | 2/2007 | Nakagawa et al. | |
| 2007/0074146 A1 | 3/2007 | Tanaka et al. | |

(Continued)

OTHER PUBLICATIONS

Cadence Design Systems, Inc. Datasheet, "Assura Parasitic Extraction," Oct. 2004, 5 pages.

(Continued)

*Primary Examiner* — Binh Tat
(74) *Attorney, Agent, or Firm* — Haynes Beffel & Wolfeld LLP; Warren S. Wolfeld (57) ABSTRACT

An EDA method is implemented for modifying a layout file after place and route. The method includes storing a library of shape modifications for cells in the design library used for implementation of the circuit. The library of shape modifications includes the results of process-specific calibration of the shape modifications which indicate adjustment of a circuit parameter caused by applying the shape modifications to the cells. The layout file is analyzed to identify a cell for adjustment of the circuit parameter. A shape modification calibrated to achieve the desired adjustment is selected from the library. The shape modification is applied to the identified cell in the layout file to produce a modified layout file. The modified layout file can be used for tape out, and subsequently for manufacturing of an improved integrated circuit.

26 Claims, 8 Drawing Sheets

(56) References Cited

U.S. PATENT DOCUMENTS

| | | | |
|---|---|---|---|
| 2007/0099314 | A1 | 5/2007 | Chen et al. |
| 2007/0106966 | A1 | 5/2007 | Inoue et al. |
| 2007/0168898 | A1 | 7/2007 | Gupta et al. |
| 2007/0170474 | A1 | 7/2007 | Kawasaki |
| 2007/0231710 | A1* | 10/2007 | Aton et al. .................. 430/5 |
| 2008/0263483 | A1 | 10/2008 | Koike et al. |
| 2008/0276215 | A1 | 11/2008 | Higuchi et al. |
| 2009/0051383 | A1 | 2/2009 | Ruf et al. |
| 2009/0083688 | A1* | 3/2009 | Moroz et al. .................. 716/11 |
| 2009/0193378 | A1 | 7/2009 | Adkisson et al. |
| 2009/0217228 | A1 | 8/2009 | Melzner |

OTHER PUBLICATIONS

Clark, Lawrence T., et al. "Managing Standby and Active Mode Leakage Power in Deep Sub-micron Design," Proc. of the 2004 Int'l Symp. on Low Power Electronics and Design Feb. 2004, 6 pages.

E. Augendre et al., Controlling STI-related parasitic conduction in 90 nm CMOS, ESSDERC, Florence, Sep. 24-26, 2002, 20 pages.

Gupta, Puneet, et al., "Selective Gate-Length Biasing for Cost-Effective Runtime Leakage Control," ACM Design Automation Conference Jun. 7-11, 2004, San Diego, CA 4 pages.

Kannan, Lalgudi, et al., "A Methodology and Algorithms for Post-Placement Delay Optimization," 31st ACM/IEEE Design Automation Conference, Jun. 6-10, 1994, 6 pages.

Mentor Graphics datasheet, "Calibre xRC Parasitic Extraction" Dec. 2004, 5 pages.

Shah, Saumil, et al., "Standard Cell Library Optimization for Leakage Reduction," ACM Design Automation Conference Jul. 24-28, 2006, San Francisco, CA 4 pages.

Synopsys, Inc. datasheet, "IC Compiler The next-generation physical design system," Sep. 2009, 6 pages.

Synopsys, Inc. datasheet, "PrimeTime Golden Timing Signoff Sollution and Environment," Sep. 2009, 5 pages.

Tang, Qian Tang, et al., "Phenomenological Model for Gate Length Bias Dependent Inverter Delay Change with Emphasis on Library Characterization," IEEE 10th Int'l Symp. on Quality Electronic Design, Mar. 16-18, 2009, 6 pages.

Gupta, Puneet, et al., "Gate-Length Biasing for Runtime-Leakage Control," IEEE Transactions on Computer-Aided Design of Integrated Circuits and Systems, vol. 25, No. 8, Aug. 2006, 1475-1485.

International Search Report from PCT/US2010/059508 mailed Jul. 29, 2011, 9 pages.

* cited by examiner

OPTICAL PROXIMITY CORRECTION AWARE INTEGRATED CIRCUIT DESIGN OPTIMIZATION

BACKGROUND OF THE INVENTION

1. Field of the Invention

The present invention relates to electronic design automation (EDA), and to implementation of layout changes for elements of integrated circuit designs for performance optimization.

2. Description of Related Art

Integrated circuit design is supported by electronic design automation. One approach to EDA supported design is based on the definition of an integrated circuit using a computer system as a netlist of circuit elements. Also, a cell library is provided that includes a number of cells that can be chosen for use in a physical implementation of the circuit elements in the netlist. The cell library has a finite number of choices for the circuit elements, as each cell in the library is pre-qualified for manufacturability and other factors. To implement the netlist, cells are selected from the library, placed in a layout space, and interconnections are defined among the cells. The selection of cells, placement of cells and defining interconnections among the cells can be referred to as placement and routing. The result is a layout file which specifies the shapes and locations of components of the cells, and of the interconnections of the cells which is to be made into an integrated circuit in a foundry.

It has been shown that small layout changes, such as transistor gate length increases, can be used to optimize integrated circuits for performance, leakage power, etc. (See, Clark, et al., "Managing Standby and Active Mode Leakage Power in Deep Sub-micron Design," In Proc. ISLPED (Newport, Calif., Aug. 9-11, 2004), 274-279).

It is not practical to provide enough choices in a cell library to provide for small layout changes used for these purposes. Also, the optimizations achieved using these small layout changes are often measurable only on analysis of the layout file after placement and routing. However, modern sub-wavelength manufacturing technologies, used to implement the circuits, experience significant optical proximity effects, for which correction is absolutely required. Consequently, in order for layout changes specified by analysis after placement and routing to be realized as intended on an integrated circuit, often times circuit designers need access to the OPC recipe. See, U.S. Pat. No. 7,441,211 by Gupta et al.

Also, there is a very wide range of shape modifications that could be applied based on analysis of a layout file to optimize performance. For example, the drive current and standby leakage current distributions along a transistor's width vary significantly. (See, E. Augendre, et al., "Controlling STI-related parasitic conduction in 90 nm CMOS and below," ESSDERC, 2002). It is therefore possible to make non-uniform gate shape changes that, for example, achieve significant leakage reduction while sacrificing the drive current only slightly. However, SPICE circuit simulators accept only rectangular gate shapes in order to invoke corresponding device models. The non-uniform shape changes once again will require noticeable custom changes in the OPC recipe.

The need for access to OPC recipes results in practical road blocks to innovation in this technology, because the OPC recipes are foundry process specific, and are usually protected as confidential information by foundries. Interaction between foundries and designers that would be necessary to allow access to the proprietary OPC recipes make these types of small layout changes impractical. This prevents IC optimization from realizing full benefits of these small layout modifications, such as in reduced leakage power.

Problems remain therefore in the realization of practical EDA tools for implementation of small layout changes for design optimization.

SUMMARY

A technology-design interface that is aware of optical proximity effect and foundry process-specific OPC technologies is provided for implementation of small layout changes for circuit optimization after place and route. Such an interface can be established by defining key layout modification parameters and carrying out technology-specific, design independent calibration of the layout modifications over the circuit parameter of interest, using the OPC recipe to be used in manufacturing. An EDA method is implemented for modifying a layout file which specifies an integrated circuit design including a plurality of cells after place and route, such that the layout file specifies shapes of components of the cells, placement of the plurality of cells and interconnections among the cells. The method includes storing a library of shape modifications for at least some of the cells in the design library used for implementation of the circuit. The library of shape modifications includes the results of process-specific calibration of the shape modifications which indicate adjustment of a circuit parameter caused by applying the shape modifications to the cells. Once the library is created, the design process is executed in which the layout file is analyzed to identify a cell for adjustment of the circuit parameter. A shape modification calibrated to achieve the desired adjustment is selected from the library. The shape modification is applied to the identified cell in the layout file to produce a modified layout file. The modified layout file can be used for tape out, and subsequently for manufacturing of an improved integrated circuit.

The library of shape modifications can be produced by specifying a set of shape modifications for cells in the design library which are suitable for small layout changes to improve circuit performance. Optical proximity correction is applied for the set of shape modifications to produce a corrected layout for the cells. The corrected layout is analyzed to determine effects of the set of shape modifications on the circuit parameter. The set of shape modifications is indexed based on the calibration results and stored in a data structure, such as a lookup table or database, suitable for use as the library. The OPC recipe used is foundry process-specific and can reliably predict the effects of the shape modifications on the physical implementations of the cells. However, the OPC process can be executed using the proprietary OPC recipes well in advance during library creation, and need not be made accessible to the circuit designers. Rather, the circuit designers rely on the library of design rule compliant, OPC aware modifications having a known effect on the desired circuit parameter.

Cells can be identified in the layout for adjustment of desired circuit parameter using EDA analysis tools. For example, a layout file can be processed for extraction of parasitic capacitances and resistances. These parasitics can be utilized along with timing characteristics from the design library to perform timing analysis and identify circuit paths in the design which have timing slack. Cells along the circuit path having available timing slack, as determined by analysis considering extracted parasitics, can be selected for modification of circuit parameters such as leakage current reduction. The specific shape modifications can be selected in a manner that ensures that the timing slack on the circuit path remains positive after the changes. The shape modifications are constrained to fall within the boundaries of the cells in the layout and to comply with design rule spacing between components of the cell. Thus, applying a shape modification from the library to an identified cell does not require a change in placement of the identified cell or of cells adjacent to the identified cell. Thus, it is desirable that shape modifications in the cell library that are available for use by the designers can be added to the design without further timing analysis, and without changing placement or routing structures.

A library of shape modifications is therefore provided for components of cells, the cells capable of use in a layout file specifying an integrated circuit design including shapes of components of the cells, placements of the cells, and interconnections among the cells. The library includes data indicating adjustments of a circuit parameter of the cells which result from applying the shape modifications to the cells in a layout file. The adjustments are calibrated by performing foundry process-specific optical proximity correction over combinations of the shape modifications with the cells. Shape modifications in the library are constrained to fall within boundaries of the cells and to comply with design rule spacing between components of the cells, such that applying a shape modification from the library to a cell does not require a change in placement of the cell.

A data processing system is described that is adapted for performing the EDA process described above.

An article of manufacture is described which comprises a machine readable data storage medium storing instructions executable by a data processing system such as described above.

An integrated circuit component manufactured by the EDA process described above is described as well.

Other aspects and advantages of the present invention can be seen on review of the drawings, the detailed description and the claims, which follow.

DETAILED DESCRIPTION

A detailed description of embodiments of the present invention is provided with reference to FIG. 1 through FIG. 10.

Figure 1:
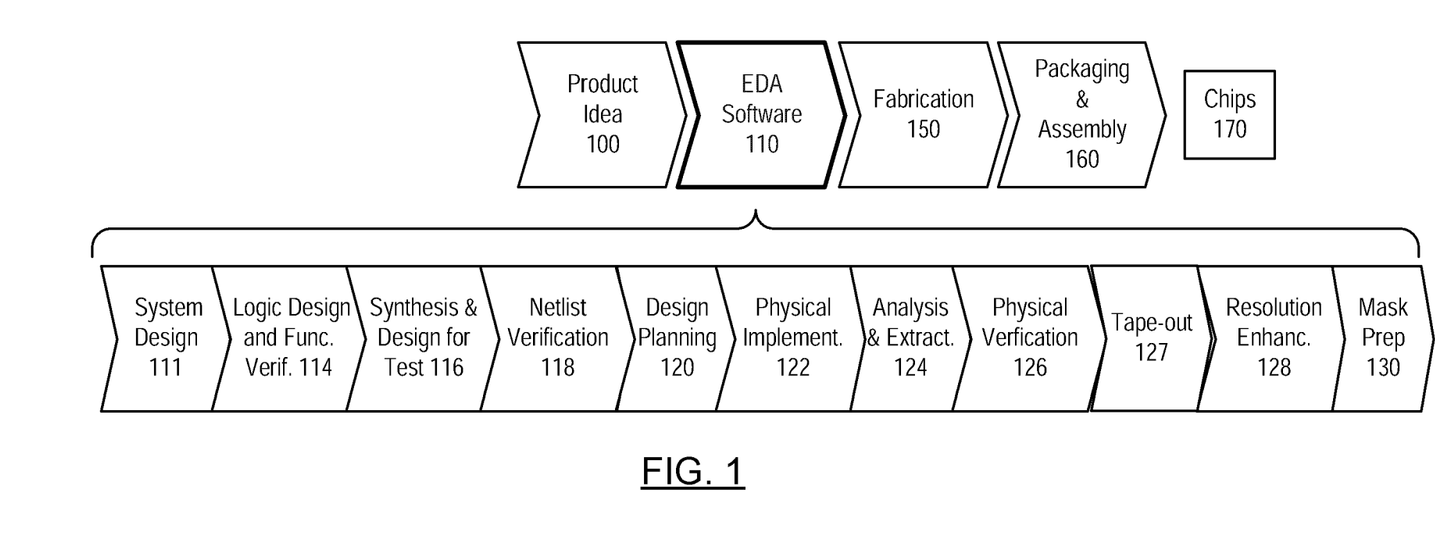
FIG. 1 is a simplified representation of an illustrative integrated circuit design flow, in which shape modifications after place and route operations as described here can be employed.

FIG. 1 is a simplified representation of an illustrative integrated circuit design flow. As with all flowcharts herein, it will be appreciated that many of the steps of FIG. 1 can be combined, performed in parallel or performed in a different sequence without affecting the functions achieved. In some cases a rearrangement of steps will achieve the same results only if certain other changes are made as well, and in other cases a rearrangement of steps will achieve the same results only if certain conditions are satisfied. Such rearrangement possibilities will be apparent to the reader.

At a high level, the process of FIG. 1 starts with the product idea (block 100) and is realized in an EDA (Electronic Design Automation) software design process (block 110). When the design is finalized, the fabrication process (block 150) and packaging and assembly processes (block 160) occur, ultimately resulting in finished integrated circuit chips (result 170).

The EDA software design process (block 110) is composed of a number of steps 111-130, shown in linear fashion for simplicity. In an actual integrated circuit design process, the particular design might have to go back through steps until certain tests are passed. Similarly, in any actual design process, these steps may occur in different orders and combinations. This description is therefore provided by way of context and general explanation rather than as a specific, or recommended, design flow for a particular integrated circuit.

A brief description of the component steps of the EDA software design process (block 110) will now be provided.

System design (block 111): The designers describe the functionality that they want to implement, they can perform what-if planning to refine functionality, check costs, etc. Hardware-software architecture can occur at this stage. Example EDA software products from Synopsys, Inc. that can be used at this step include Model Architect, Saber, System Studio, and DesignWare® products.

Logic design and functional verification (block 114): At this stage, high level description language (HDL) code, such as the VHDL or Verilog code, for modules in the system is written and the design is checked for functional accuracy. More specifically, the design is checked to ensure that it produces the correct outputs in response to particular input stimuli. Example EDA software products from Synopsys, Inc. that can be used at this step include VCS, VERA, DesignWare®, Magellan, Formality, ESP and LEDA products.

Synthesis and design for test (block 116): Here, the VHDL/Verilog is translated to a netlist. The netlist can be optimized for the target technology. Additionally, the design and implementation of tests to permit checking of the finished chip occurs. Example EDA software products from Synopsys, Inc. that can be used at this step include Design Compiler®, Physical Compiler, Test Compiler, Power Complier, FPGA Compiler, TetraMAX, and DesignWare® products.

Netlist verification (block 118): At this step, the netlist is checked for compliance with timing constraints and for correspondence with the VHDL/Verilog source code. Example EDA software products from Synopsys, Inc. that can be used at this step include Formality, PrimeTime, and VCS products.

Design planning (block 120): Here, an overall floor plan for the chip is constructed and analyzed for timing and top-level routing. Example EDA software products from Synopsys, Inc. that can be used at this step include Astro and IC Compiler products.

Physical implementation (block 122): The placement (positioning of circuit elements) and routing (connection of the same) occurs at this step. Example EDA software products from Synopsys, Inc. that can be used at this step include AstroRail, Primetime, and Star RC/XT products.

Analysis and extraction (block 124): At this step, the circuit function is verified at a transistor level, this in turn permits what-if refinement. Example EDA software products from Synopsys, Inc. that can be used at this stage include Astro-Rail, PrimeRail, Primetime, and Star RC/XT products. Parasitic extraction from the placed and routed circuit design is complemented with timing information from the design library to produce final timing values, which can be used for verification and for identifying circuit paths that have usable slack.

Physical verification (block 126): At this stage various checking functions are performed to ensure correctness for: manufacturing, electrical issues, lithographic issues, and circuitry. Example EDA software products from Synopsys, Inc. that can be used at this stage include the Hercules product.

Along with processes in the physical verification stage, or in the analysis and extraction stage, design rule compliant geometry modifications can be added to improve electrical characteristics of the design, such as effective gate length improvements to reduce leakage current, which do not require a return to placement and routing processes. Processes for adding geometry modifications in this stage are described in more detail below. These processes can be integrated with, or used in combination with, products like IC Compiler which provides a place and route function, or PrimeTime which provides post place and route analytical tools, both of which are available from Synopsys, Inc.

Tape-out (block 127): This stage provides the "tape-out" data for production of masks for lithographic use to produce finished chips. Example EDA software products from Synopsys, Inc. that can be used at this stage include the CATS(R) family of products.

Resolution enhancement (block 128): This stage involves geometric manipulations of the layout to improve manufacturability of the design. Aerial image simulation based on convolution algorithms executed using multi-core processing systems as described herein, can be used in this stage of the design, as well as other stages. Example EDA software products from Synopsys, Inc. that can be used at this stage include Proteus/Progen, ProteusAF, and PSMGen products.

Mask preparation (block 130): This stage includes both mask data preparation and the writing of the masks themselves. Example EDA software products from Synopsys, Inc. that can be used at this stage include CATS(R) family of products.

Embodiments of the convolution technology described herein can be used during one or more of the above-described stages.

Figure 2:
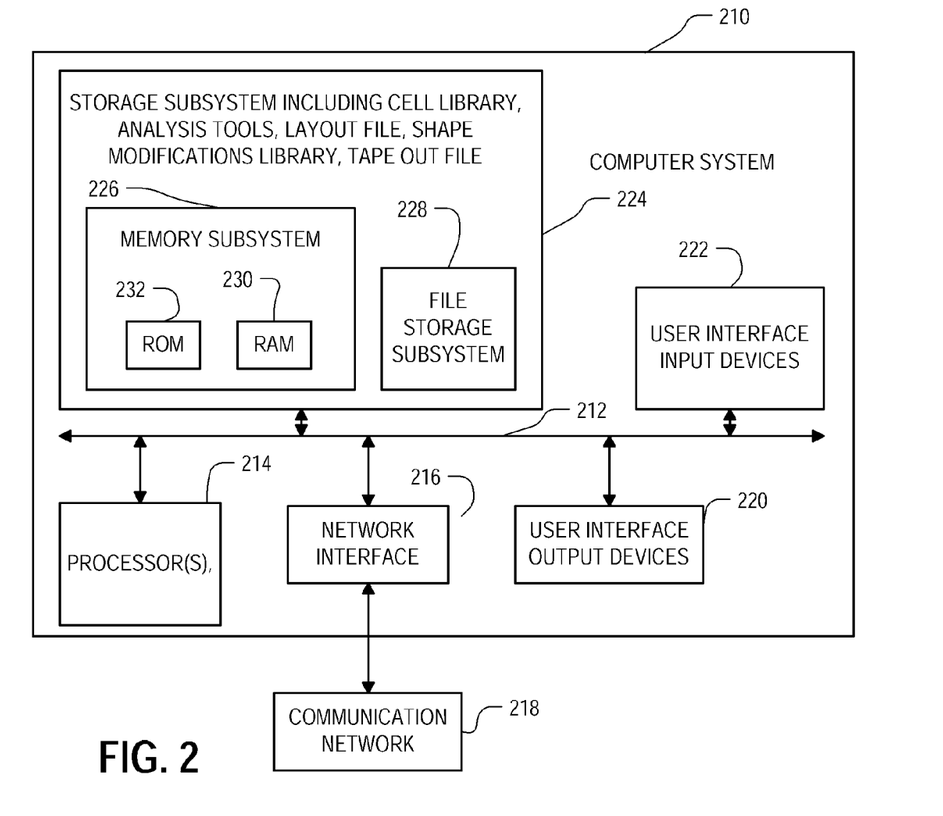
FIG. 2 is a simplified block diagram of a data processing system suitable for the operations described herein.

FIG. 2 is a simplified block diagram of a computer system 210 suitable for use with embodiments of the technology. Computer system 210 typically includes processor(s) 214 which can communicate with a number of peripheral devices via bus subsystem 212.

The peripheral devices may include a storage subsystem 224, comprising a memory subsystem 226 and a file storage subsystem 228, user interface input devices 222, user interface output devices 220, and a network interface subsystem 216. The input and output devices allow user interaction with computer system 210. Network interface subsystem 216 provides an interface to outside networks, including an interface to communication network 218, and is coupled via communication network 218 to corresponding interface devices in other computer systems. Communication network 218 may comprise many interconnected computer systems and communication links. These communication links may be wireline links, optical links, wireless links, or any other mechanisms for communication of information. While in one embodiment, communication network 218 is the Internet, in other embodiments, communication network 218 may be any suitable computer network.

User interface input devices 222 may include a keyboard, pointing devices such as a mouse, trackball, touchpad, or graphics tablet, a scanner, a touchscreen incorporated into the display, audio input devices such as voice recognition systems, microphones, and other types of input devices. In general, use of the term "input device" is intended to include all possible types of devices and ways to input information into computer system 210 or onto communication network 218. The user interface input devices 222 can be used for identifying evaluation points, selecting kernels or other functions for operations on evaluation points, and for supplying other input data.

User interface output devices 220 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from computer system 210 to the user or to another machine or computer system. User interface output devices 220 can be used for providing graphic displays of the results of the operations described herein.

Storage subsystem 224 stores the basic programs of instructions and data constructs that provide the functionality of some or all of the EDA tools described herein, such as the IC Compiler Suite and the PrimeTime suite available from Synopsys, Inc. including the layout files, a shape modification library, and programs of instruction for executing the processes described below to apply small layout changes after place and route for circuit optimization.

Memory subsystem 226 typically includes a number of memories including a main random access memory (RAM) 230 for storage of instructions and data during program execution and a read only memory (ROM) 232 in which fixed instructions are stored. File storage subsystem 228 provides persistent storage for program and data files, and may include a hard disk drive, a floppy disk drive along with associated removable media, a CD-ROM drive, an optical drive, or removable media cartridges. The databases and modules implementing the functionality of certain embodiments may be stored by file storage subsystem 228. The shared memory of a multi-core processor can be separate from the storage subsystem or part of it, depending on the architecture deployed.

Bus subsystem 212 provides a mechanism for letting the various components and subsystems of computer system 210 communicate with each other as intended. Although bus subsystem 212 is shown schematically as a single bus, alternative embodiments of the bus subsystem may use multiple busses.

Figure 2A:
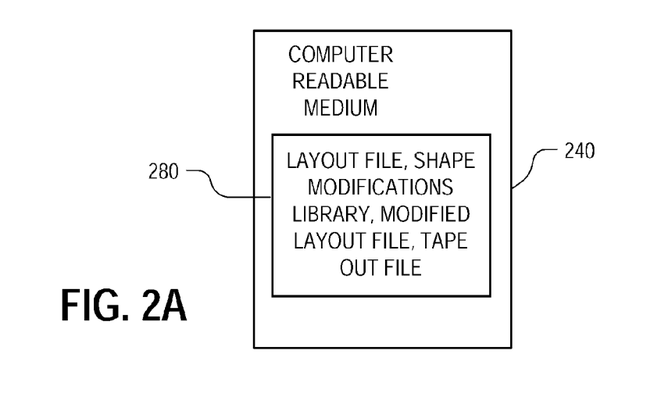
FIG. 2A illustrates an article of manufacture that comprises a computer readable medium on which a layout file, a shape modifications library, a tape out file and other computer software resources as described herein can be stored and distributed.

FIG. 2A shows an article of manufacture comprising a computer readable medium 240, which can be a medium associated with file storage subsystem 228, and/or with network interface subsystem 216. The computer readable medium 240 can be a hard disk, a floppy disk, a CD-ROM, an optical medium, removable media cartridge, a tape drive, flash memory or other data storage medium on which instructions executable by a computer are stored for distribution and/or safekeeping. The computer readable medium 240 stores data structures and executable files 280, including a layout file, a shape modification library, and programs of instruction for executing the processes described below to apply small layout changes after place and route for circuit optimization.

The description of computer system 210 depicted in FIG. 2 is intended only for purposes of illustrating the possible embodiments. Many other configurations of computer system 210 are possible having more or less components than the computer system depicted in FIG. 2. The computer system 210 in some embodiments includes a number of stations, each of which can have the components illustrated in FIG. 2, in a distributed architecture or in a server farm arrangement.

The computer system 210 includes resources such as commercially available in IC Compiler and PrimeTime referred to above. Such resources produce a layout file in which the cells selected for physical implementation of a netlist are placed and routed. A file defining the placed and routed design is created, including information about timing of the cells and the shapes and placement of components of the cells as reflected for example, in lithographic mask layouts for multiple layers of the cells and the interconnect structures for the cells. The placed and routed design can be further analyzed using tools available in PrimeTime for example, to extract parasitic capacitances and resistances that arise from the placed and routed design that are not completely characterized by the timing information available in the placed and routed file. One tool part of the primetime suite divided by Synopsys, Inc., which can be used for the extraction process is known as Star RC XT. Similar tools used in the industry for the extraction process include Calibre xRC from Mentor Graphics, Inc. and Assura Parasitic Extraction from Cadence Design Systems, Inc. After extraction, further timing analysis can be performed in which the timing of circuit paths in the design are verified.

As part of the timing analysis, circuit paths in the design can be identified which have timing slack. Circuit paths having timing slack have the characteristic that signals propagating on the circuit path meet timing specifications with time to spare known as slack. Such circuit paths can be safely optimized using tools that affect the speed of operation of the cells on the circuit paths, so long as delay introduced by such modifications does not consume all of the available timing slack. Non-uniform gate length modifications as described herein are one class of modification that can reduce leakage current while having acceptable impact on delay.

One circuit parameter which can be optimized at this stage is leakage power for the integrated circuit. Cells can be modified by adjusting the gate length, or otherwise, to optimize this parameter at this stage. The computer system can utilize the timing analysis after extraction to identify circuit paths having sufficient slack to allow a modification of the circuit parameter. A process can then walk the identified circuit paths to identify cells which are suitable for modification along the path. Also, it is possible to identify cells along the paths that are preferred candidates for modification, such as by referring to the available timing slack, and the amount of leakage power which can be reduced within that timing slack for particular cells on the path. The cells are identified that can have the desired impact on the design.

The computer system 210 can provide an interface supporting modifications at this stage. First, a library of shape modifications is produced, by defining key layout modification parameters for cells in the design file and carrying out technology-specific, design independent calibration for the cells. By calibration, potential modifications are processed to establish an amount of adjustment of the effective gate length (or other layout parameter), and to establish the impact on timing delay through the cell.

In a system as described herein used for reducing leakage current for a circuit design after place and route, a designer can select layout parameters for specific modification types that define an OPC-enabled, resulting gate shape both for uniform (constant over active area) and non-uniform (varying over active area) gate length modification. Four representative parameters for a shape modification type suitable for gate length adjustments are illustrated in FIGS. 3-5.

Figures 3, 4, 5:
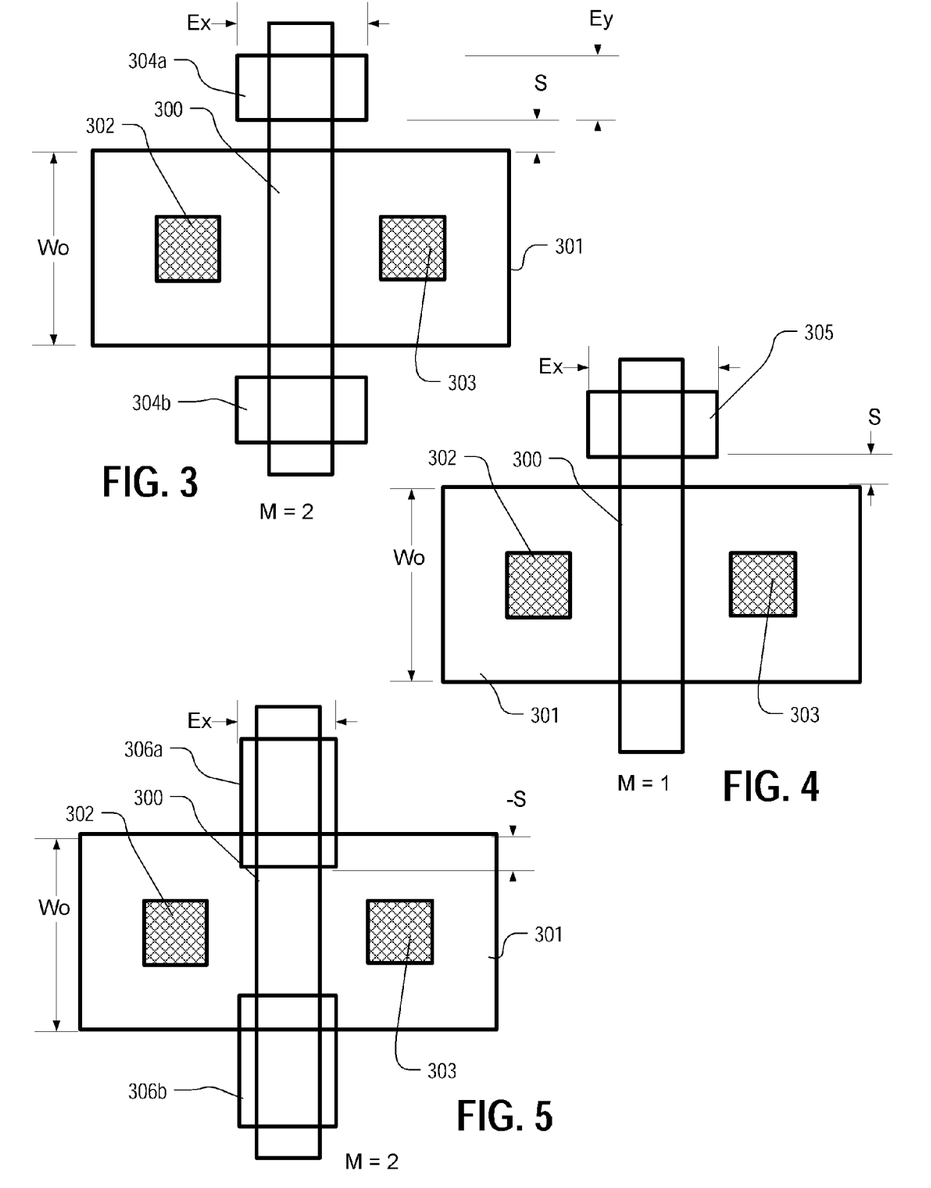
FIGS. 3-5 illustrate representative shape modifications for a layout of a basic field effect transistor after placement and routing.

FIGS. 3-5 show a field effect transistor FET layout, which can constitute a simple cell in the library or a part of a larger cell. The FET layout includes a gate 300 overlying an active region 301, in which contacts are placed in areas 302 and 303. The gate 300 is a rectangular shape having a nominal gate length, defined as the length beneath the gate of a current path between the opposing sides of the active region 301, where contact areas 302 and 303 lie in the opposing sides. The width of the gate (orthogonal to the current path) is established by the width $W_o$ of the active region over which the gate 300 lies. The effective gate width can be adjusted by adding annotations 304a and 304b as shown in a FIG. 3 on opposing sides of the gate 300, annotation 305 as shown in FIG. 4 on one side of the gate 300, and annotations 306a and 306b as shown in FIG. 5 on opposing sides of the gate. The annotations are characterized by having an impact on the width of the gate 300 in the active region 301 after the combined shape of the gate 300 and the annotations are subjected to an OPC recipe. For example, rather than having sharp corners, the annotations 304a and 304b or annotations 306a and 306b combined with the gate 300 will result in a gate length at the both edges of the active region larger than the gate length in the center of the active region. Annotation 305 will result in an asymmetric gate with curved sides. This set of annotations can be characterized by, for example, the parameters $E_x$, S, $E_y$, $W_o$ and M, where $E_x$ is the length of the annotation in the gate length dimension, S is the offset (positive or negative) of the annotation from the edge of the active region 301, $E_y$ is the width of the annotations, $W_o$ is the width of the active region and M indicates the symmetry of the annotation, i.e. whether it is on one side or both sides of the active region.

A process-specific OPC recipe provided by a foundry is then applied to the modified gate shape to create the foundry process-specific contour that will be attained on silicon. Contour-to-electrical analysis tools validated by the foundry, such as SeisMOS CX available from Synopsys, Inc., are used to process the gate contour to extract the electrically equivalent transistor dimensions (width and length). This procedure is repeated to cover a variable space for the variables $E_x$, S, $E_y$, $W_o$ and M for both N and P transistors for this annotation type.

A calibration table can thus be established of the type shown in Table 1 usable as a shape modification library. In this example, the table can be organized so that for each transistor of a specific type shown in FIGS. 3-5 having either N-type or P-type active regions, gate width $W_o$ and a nominal gate length in the placed and routed file, the necessary annotation dimensions ($E_x$, S, $E_y$ and M) are specified for corresponding gate length adjustments (Intended $L_G$ change). Therefore, once the foundry process-specific calibration is completed, the calibration table can be used to identify the necessary annotation dimensions ($E_x$, S, $E_y$ and M) for desired gate shape changes to achieve transistor specific, design-intended gate length $L_G$ changes.

| Intended $L_G$ change | Xtor type/ $W_o$ | M | $E_x$ | S | $E_y$ |
|---|---|---|---|---|---|
| 2 nm | N/50 nm | 2 | 84 nm | 50 nm | 60 nm |
| 4 nm | N/50 nm | 2 | 84 nm | 40 nm | 60 nm |
| 6 nm | N/50 nm | 2 | 84 nm | 30 nm | 60 nm |

Depending on the implementation, the annotations can be defined on a cell-by-cell basis for more complex cells used in the layout, such as NAND gates, NOR gates, buffers, inverters and so on.

Figure 6:
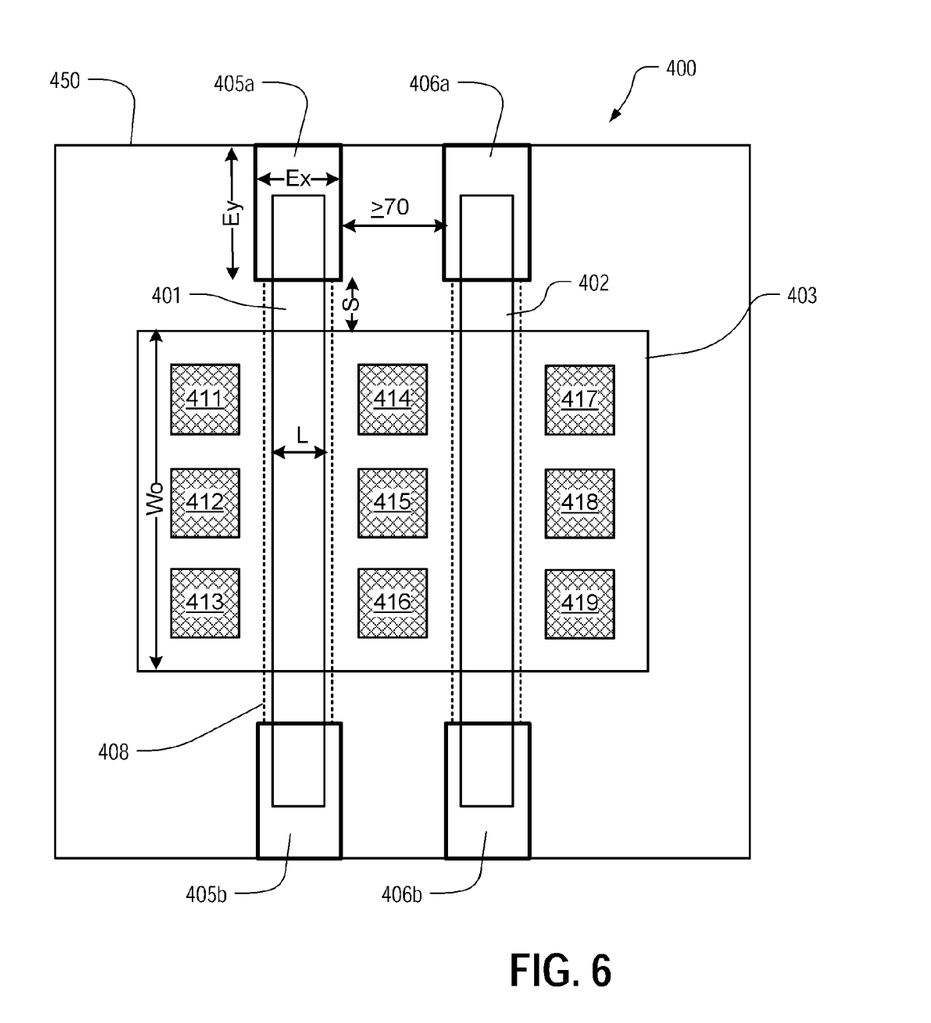
FIG. 6 illustrates an integrated circuit component including representative shape modifications for a layout of a more complex cell including two field effect transistors after placement and routing.

FIG. 6 shows an integrated circuit component for a simplified example including two-transistor cell 400. The cell 400 has a nominal or actual boundary 450 in the layout file represented heuristically by the rectangular outline in the drawing, and usable by design rule checking and place and route tools. In the cell 400, a first gate 401 and a second gate 402 cross an active region 403. A first row of contacts 411-413 is placed to the left of gate 401 in the active region 403. A second row of contacts 414-416 is placed between gates 401 and 402 in the active region 403. A third row of contacts 417-419 is placed to the right of gate 402 in the active region 403. The gate length $L_G$ for each of the gates 401 and 402 is equal in this example. The width $W_o$ of the active region over which the gates 401 in 402 extend is also equal for each of the gates. The annotations 405a and 405b are placed on opposite ends of the gate 401. Likewise, annotations 406a and 406b are placed on opposite ends of the gate 402. The annotation dimensions are defined by the parameters S, $E_x$ and $E_y$ in this example, where S defines offset from the active region, $E_x$ defines the length of the annotation in the gate length dimension, and $E_y$ defines the width of the annotation extending away from the active region in the gate width dimension. As illustrated, the design rules specify a minimum spacing between annotations in order to satisfy requirements of the manufacturing process.

In this example, it is required that the spacing between the annotations is greater than or equal to about 70 nm. This is one example of a design rule which constrains the types of annotations that can be utilized after place and route, so that the annotations do not require returning in the design flow to the place and route process. Also, any adjustments in the gate width should not violate design rules concerning spacing between contacts and the edges of the gate structure. Thus, simply expanding the width of the gate as indicated by the dashed lines (e.g. dashed line 408) parallel with the gate edges may not be a viable option in some cells. Also, it may be viable only for limited amounts of gate length adjustment, after which annotations which caused non-uniform gate length characteristics can be utilized if they have additional leeway between the contacts and the resulting curved edges of the gate. Thus, in order to achieve a reduction of leakage current in a cell like that shown in FIG. 6, a family of annotations could be defined based on the parameters S, $E_x$, $E_y$ and $L_G$. For example, the annotation library could have data available for annotations with the parameter S equal to 10 nm, 20 nm and 30 nm; the parameter $E_x$ equal to 40 nm, 50 nm and 60 nm; the parameter $E_y$ equal to 40 nm, 60 nm and 80 nm; and the $L_G$ equal to the nominal value from the library of 30 nm, or an adjusted width, which does not violate design rules in connection with the balance of the cell, of a maximum of 34 nm.

In alternative systems, rather than specifying discrete shape modifications on a dimension in the library, the library can specify a range in the dimension of the annotations along with calibration factors which can be utilized to predict the results of changes in the dimension within ranges. Thus, one or both of discrete modifications on one or more dimensions of an annotation, and continuous modifications within specified ranges on one or more dimensions of an annotation can be defined in the library that are suitable for particular cells. Also, examples here show rectangular annotations that are centered on the gate structure. Off-center annotations and annotations having shapes other than rectangles can be used as well.

The annotations shown in FIGS. 3-5 result in non-uniform gate length adjustment. It can be useful in some designs to provide as well for annotations that simply make the gate shape dimension bigger in the gate length dimension, for uniform gate length adjustment across the active region.

In this illustration, the shape modifications are limited to annotations for the gate structure. In alternatives, other components of the cell can be modified such as the contours of the active region and the like, as is suitable for the cell library, the circuit parameter being optimized, the manufacturing process and other factors. The modifications available should not extend beyond the cell in a manner that would alter the boundary of the cell as it is defined for the purposes of the design rules being utilized. In this way, the impacts of shape modifications can be confined to the cells being modified, and not propagated into adjacent cells. The shape modifications are constrained to fall within boundaries which can be nominal or actual, of the cells (e.g. boundary 450) in the layout and to comply with design rule spacing between components of the cells, such that applying a shape modification from the library to the identified cell does not require a change in placement of the identified cell or of cells adjacent to the identified cell.

Given a desired amount of change in the selected parameter, such as leakage current, and the slack available for adjustment of the cell, the dimensions of the annotations can be determined by reference to a lookup table, or other library data structure, of available annotations. The annotations can be applied to the placed and routed design, without requiring further iterations of placement and routing. Also, the annotations can be reliably applied because they have been calibrated for the desired adjustment of a circuit parameter, such as gate length adjustment, leakage current reduction or other equivalent or similar circuit parameter, using foundry process-specific OPC recipes.

Figure 7:
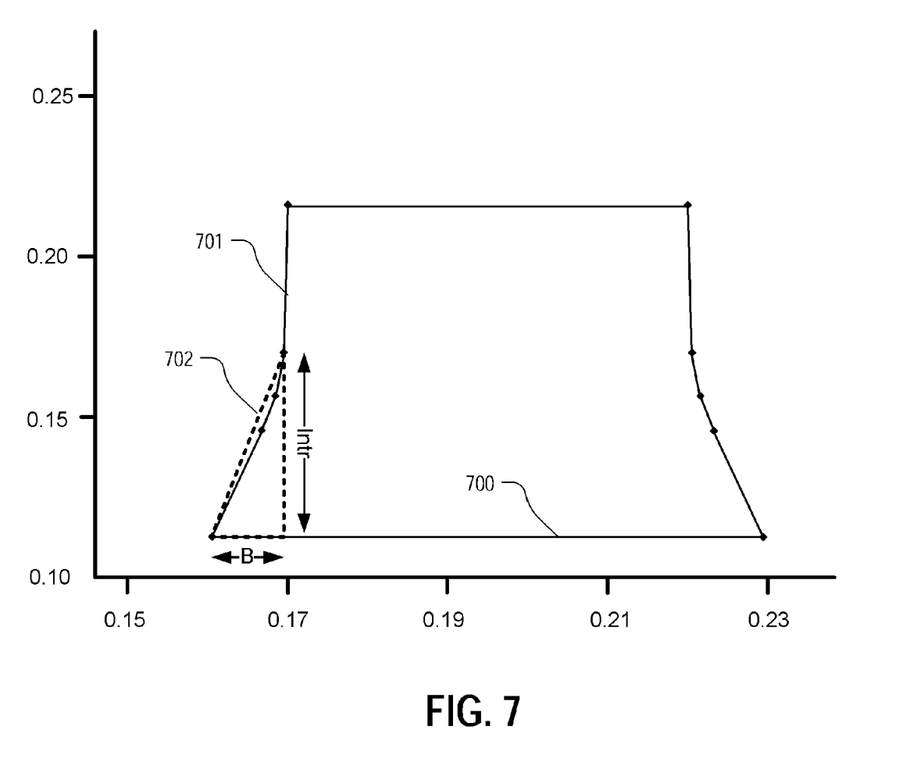
FIG. 7 is a graph illustrating the effects of shape modifications like those shown in FIG. 6 on a gate structure such as can be determined by applying an OPC recipe.

FIG. 7 illustrates a layout of a gate structure made using an annotation like that shown in FIG. 6 in which the horizontal axis in microns lies in the gate length dimension, and the vertical axis in microns lies in the gate width dimension. Line 700 of the layout corresponds with the edge of the active region. Line 701 of the layout shows the non-uniform contour which results from the annotation. The non-uniform contour includes region 702 represented by the dashed line triangle. The long side "Intr" of the triangle shows the intrusion of the gate width adjustment from the edge of the active region into the active region until the nominal gate width is resumed. The short side B of the triangle shows the extension of the gate width as a result of the annotation beyond the nominal width.

In some technologies, the use of non-uniform gate length structures results in significant reduction in leakage current while having a very small impact on the drive strength or speed of the transistor. Thus, it can be preferable to use annotations which results in non-uniform modifications in the shape of structures in the cells for certain applications such as leakage current reduction.

Figure 8:
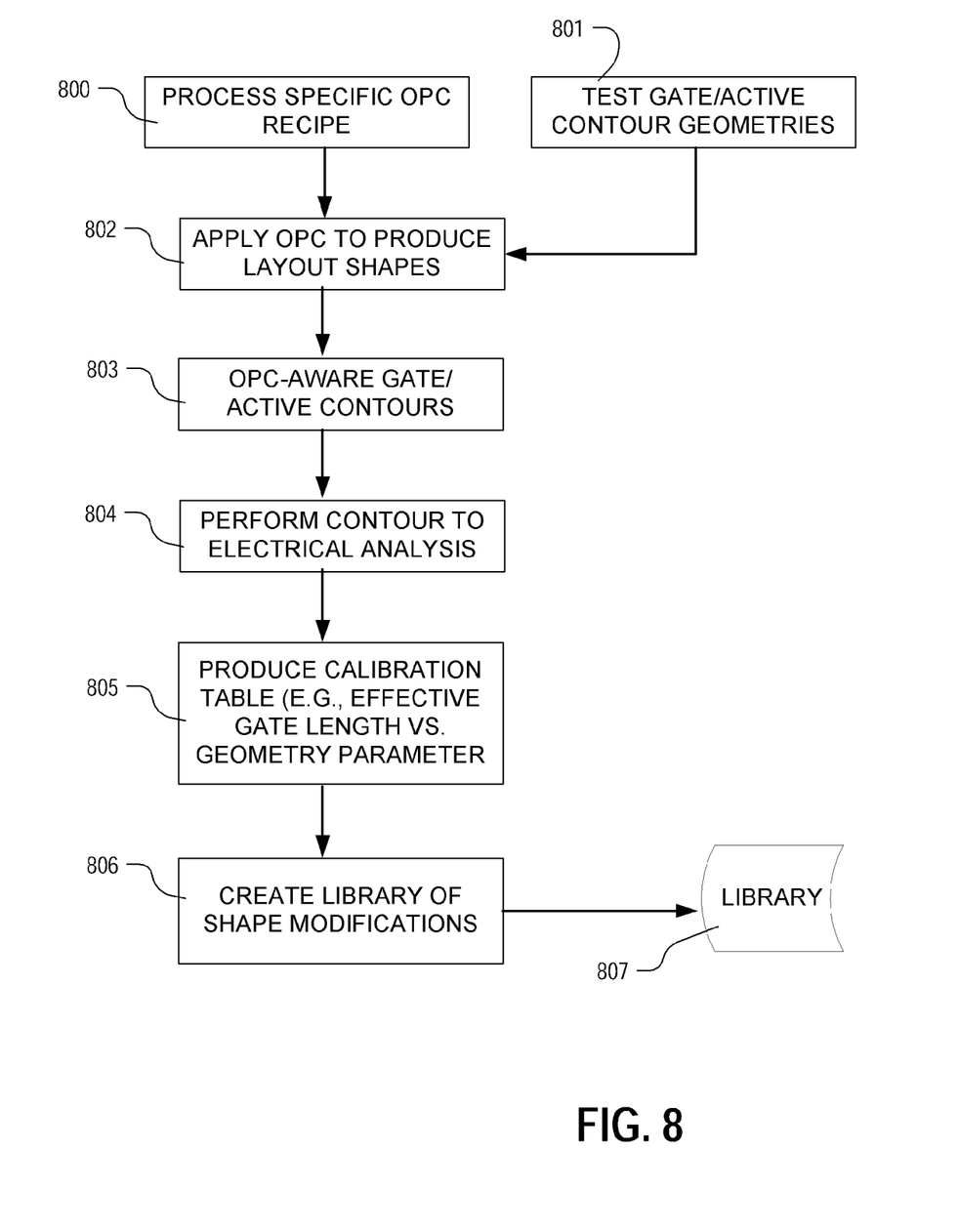
FIG. 8 is a simplified flowchart for a process used to create a library of shape modifications to be used in a process as described here.

FIG. 8 shows a process for developing a library of shape modifications. In this process, inputs include a process specific OPC recipe (800) such as available from the foundry to be utilized to manufacture the device, and a set of test gate/active contour geometries (801). The optical proximity correction process is applied using the OPC recipe to produce resulting layout shapes (802). As a result, OPC-aware of gate/active contours are provided (803). Then, contour-to-electrical analysis is performed (804), using a tool such as SeisMOS CX available from Synopsys, Inc., or equivalent products, which are validated by the foundry. Contour-to-electrical analysis provides information about the effective gate length of a transistor in the cell as a result of applying an annotation of the dimensions analyzed. The effective gate length can be defined for example by reference to the leakage current of the cell, where a cell with a non-uniform gate length as a result of application of annotation as described herein, having an effective gate length of X has the same leakage current characteristic as that of a otherwise equivalent cell with a uniform gate length of X.

The results of the contour-to-electrical analysis are arranged in a calibration table for the cell (805). The process is repeated for all of the cells which are candidate for adjustment and combined in a library of shape modifications (806), which is stored as a machine-readable file 807 usable during the design flow.

Figure 9:
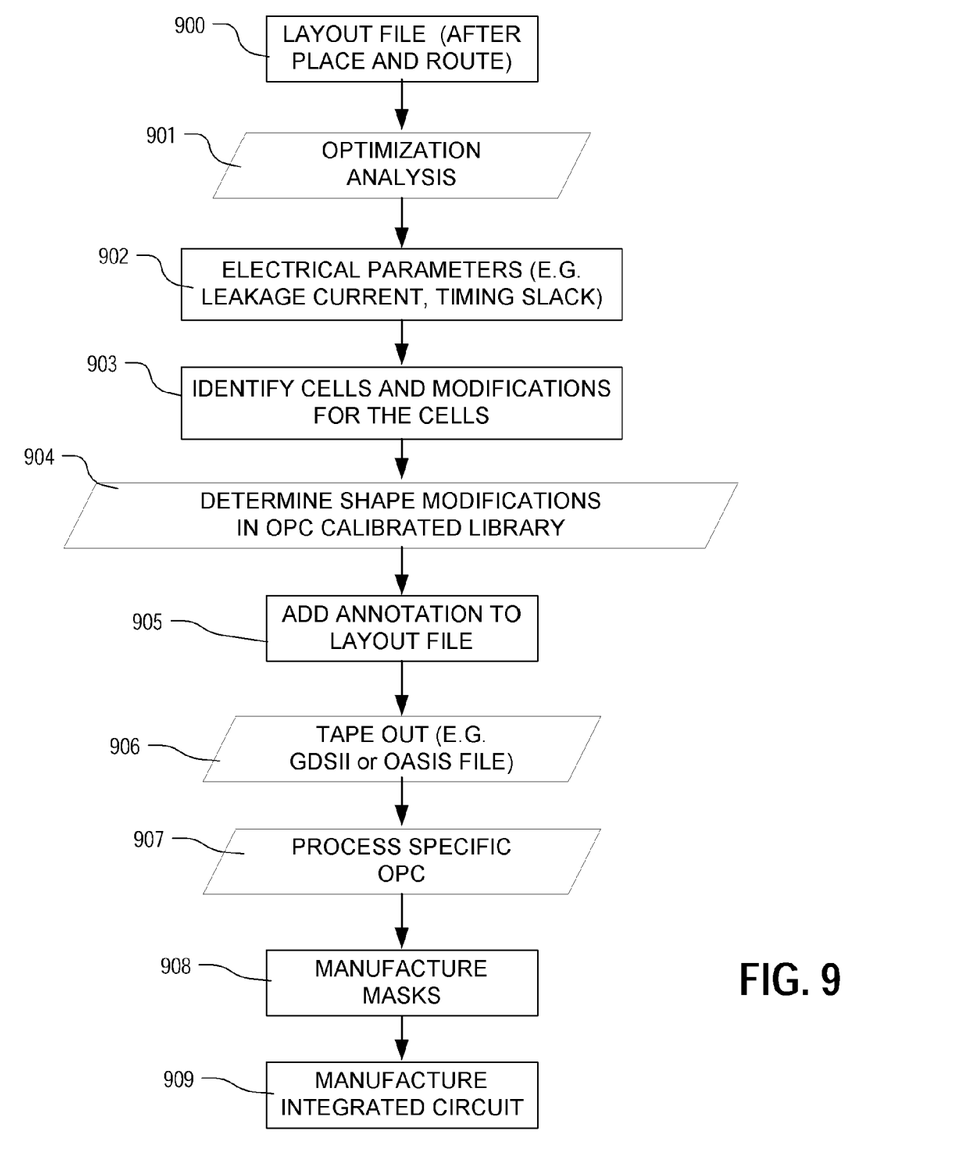
FIG. 9 is a simplified flowchart for an integrated circuit design process utilizing shape modifications after place and route as described here.

FIG. 9 is a simplified flowchart for the shape modification process described herein. This flowchart begins with input of the layout file after place and route (900). The layout file can have a hierarchical structure in which shapes and locations of multiple layers of the cells selected for implementation and of interconnect structures for connecting the cells are specified for the integrated circuit structure to be manufactured. After place and route, the layout file is submitted for optimization analysis (901). The optimization analysis will include extraction of parasitic capacitance and resistance and re-computation of timing performance of the design using the extracted parameters and information from the cell library for cells used in the layout file. As result of the optimization analysis, electrical parameters are provided for the design, including leakage current, timing slack and so on (902). Using the information from the optimization analysis, cells are identified which are candidates for shape modifications as described herein, and specific shape modifications can be selected to achieve improvement of a specified circuit parameter (903). For example, the process can identify all circuit paths having slack, and the cells on such circuit paths which have entries in the shape modification library can be identified as suitable candidates for modification. The procedure can then simply optimize all of such cells, or perform further filtering to reduce the number of modifications to be applied.

Given the identification of cells to be modified, reference is made to the OPC calibrated library of shape modifications to determine shape modifications for each selected cell (904). The selected annotation is then added to the layout file in connection with the identified cell to produce a modified layout file (905). The selected annotations can be added for example to a layout file as an annotation layer in a Graphic Data System II (GDSII) format file. Alternatively, the selected annotations can be used to modify the layout file in other ways. The modified layout file is now ready for "sign off" in this procedure, and can be used for tape out.

The manufacturing process proceeds with tape out (906), without requiring further iterations of placement and routing. As a result of the tape out process, a tape out file is generated using a layout format language such as GDSII or the Open Artwork System Interchange Standard (OASIS) which is suitable for delivery to the manufacturer. Process specific OPC is carried out using the tape out file, where the process specific OPC matches that used in generation of the calibrated table of shape modifications (907). After optical proximity correction, masks are manufactured to be used in the manufacturing process (908). Finally, the integrated circuit is manufactured utilizing the masks (909).

Figure 10:
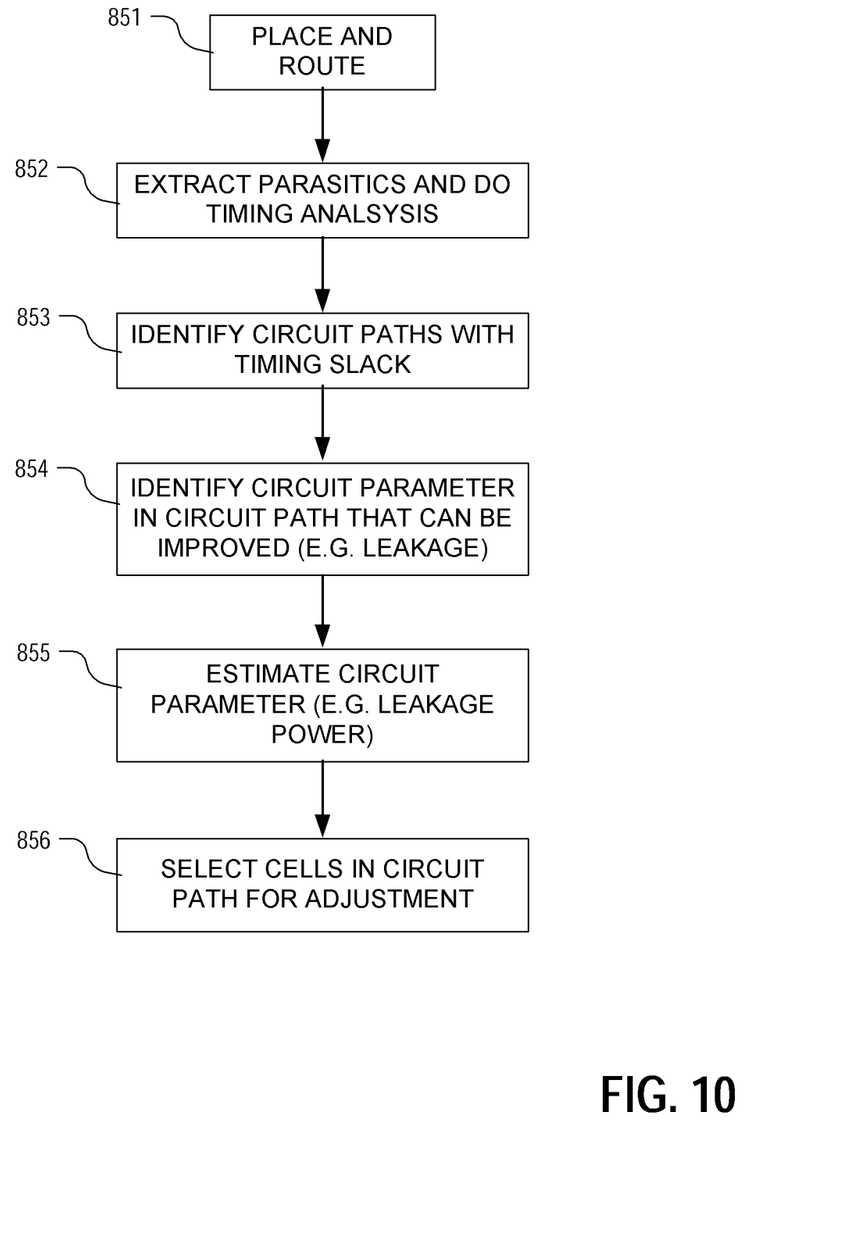
FIG. 10 is a simplified flowchart of a process for analyzing a layout file after place and route to select cells for adjustment using shape modifications as described herein.

FIG. 10 is a process flow for optimization analysis and identifying cells for shape modifications, like that which could be applied at steps 901 to 903 in FIG. 9. In this flow, the process begins with the place and route tool (851). The output of the place and route tool is a layout file from which parasitics can be extracted and timing analysis performed in a manner which can be more precise than that available from the cell library for the placed and routed layout file (852). Next, circuit paths having timing slack are identified (853). In this flow, a circuit parameter in the circuit paths that can be improved, such as current leakage, is identified (854). The value of the circuit parameter for each circuit path is estimated or calculated (855). Next, cells in each circuit path are selected based on an estimated value of the circuit parameter to be adjusted, the available timing slack which can be impacted by circuit modifications, and the effectiveness of the modifications on improving the selected circuit parameter.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for modifying a layout file specifying an integrated circuit design including a plurality of cells, the layout file specifying shapes of components of the cells, placements of the plurality of cells, and interconnections among the cells, the method comprising:
   storing, in a machine readable data storage medium accessible to a computer system, a library of shape modifications for components of cells, the library including data indicating adjustments of a circuit parameter of the cells which result from applying the shape modifications to the cells;
   identifying a cell in the layout file for adjustment of the circuit parameter, the identified cell having a plurality of transistors;
   selecting a shape modification for the identified cell from the library of shape modifications; and
   a computer system applying the shape modification to the identified cell in the layout file using the selected shape modification to produce a modified layout file.

2. The method of claim 1, including producing said library by specifying a set of shape modifications for a set of cells which can be used in the plurality of cells, at least one of the cells in the set of cells having a plurality of transistors;
   performing optical proximity correction (OPC) for the set of shape modifications to produce a corrected layout for the set of cells;
   analyzing the corrected layout to determine effects of the set of shape modifications on the circuit parameter for the set of cells; and
   indexing the set of shape modifications for the set of cells by effects on the circuit parameter.

3. The method of claim 2, wherein said performing OPC includes applying an OPC recipe used in a pre-specified manufacturing process for an integrated circuit based on the layout file.

4. The method of claim 1, wherein the circuit parameter is a function of effective gate length of a first transistor in the identified cell, and said library of shape modifications includes shape modifications that cause changes in effective gate length.

5. The method of claim 4, wherein the first transistor in the identified cell has an active region and a rectangular gate shape over the active region, and the library includes a set of shape modifications for the first transistor, including a rectangular annotation of the rectangular gate shape having a width greater than a width of the rectangular gate shape in a gate length dimension, an offset from an edge of the active region, and a height orthogonal to the gate length dimension.

6. The method of claim 4, wherein the first transistor in the identified cell has an active region and a rectangular gate shape over the active region, and the library includes a set of shape modifications for the first transistor, including first and second rectangular annotations of the rectangular gate shape on opposing sides of the active region, each of the first and second rectangular annotations having a width greater than a width of the rectangular gate shape in the gate length dimension, an offset from an edge of the active region, and a height orthogonal to the gate length dimension.

7. The method of claim 1, wherein the identified cell includes a first transistor having an active region, a gate shape over the active region, and at least one contact placed in the active region adjacent the gate shape, and wherein the shape modifications in the library for the identified cell maintain design rule spacing between the gate in the modified shape and the at least one placed contact.

8. The method of claim 1, including analyzing a circuit specified by the layout file, including:
identifying a circuit path in the layout file having timing slack;
selecting cells in the circuit path which can be modified to reduce leakage current in the circuit path; and
specifying gate length adjustments for transistors in the selected cells to reduce leakage current, wherein said identified cell is one of the selected cells.

9. The method of claim 1, including taping out the modified layout file, without modifying placement of the identified cell.

10. The method of claim 1, wherein at least one of the cells in the plurality of cells includes an FET transistor, and said library includes shape modifications for a gate of the FET transistor which result in non-uniform gate lengths across the width of the channel.

11. The method of claim 1, wherein the shape modifications are constrained to fall within boundaries of the cells in the layout and to comply with design rule spacing between components of the cells, such that applying a shape modification from the library to the identified cell does not require a change in placement of the identified cell or of cells adjacent to the identified cell.

12. The method of claim 1, including manufacturing an integrated circuit using the modified layout file.

13. A data processing system adapted for performing a convolution of a kernel over a layout, comprising:
a processor and memory storing a layout file, a library of shape modifications, and instructions executable by the processor;
the layout file specifying an integrated circuit design including a plurality of cells, the layout file specifying shapes of components of the cells, placements of the plurality of cells, and interconnections among the cells;
the library of shape modifications for components of cells, the library including data indicating adjustments of a circuit parameter of the cells which result from applying the shape modifications to the cells;
the instructions including logic to identify a cell in the layout file for adjustment of the circuit parameter, to select a shape modification for the identified cell from the library of shape modifications, and to apply the shape modification to the identified cell in the layout file using the selected shape modification to produce a modified layout file, wherein the identified cell has a plurality of transistors.

14. The system of claim 13, wherein said library is produced by specifying a set of shape modifications for a set of cells which can be used in the plurality of cells, at least one of the cells in the set of cells having a plurality of transistors;
performing optical proximity correction (OPC) for the set of shape modifications to produce a corrected layout for the set of cells;
analyzing the corrected layout to determine effects of the set of shape modifications on the circuit parameter for the set of cells; and
indexing the set of shape modifications for the set of cells by effects on the circuit parameter.

15. The system of claim 14, wherein said performing OPC includes applying an OPC recipe used in a pre-specified manufacturing process for an integrated circuit based on the layout file.

16. The system of claim 13, wherein the circuit parameter is a function of effective gate length of a first transistor in the identified cell, and said library of shape modifications includes shape modifications that cause changes in effective gate length.

17. The system of claim 16, wherein the first transistor in the identified cell has an active region and a rectangular gate shape over the active region, and the library includes a set of shape modifications for the first transistor, including a rectangular annotation of the rectangular gate shape having a width greater than a width of the rectangular gate shape in a gate length dimension, an offset from an edge of the active region, and a height orthogonal to the gate length dimension.

18. The system of claim 16, wherein the first transistor in the identified cell has an active region and a rectangular gate shape over the active region, and the library includes a set of shape modifications for the first transistor, including first and second rectangular annotations of the rectangular gate shape on opposing sides of the active region, each of the first and second rectangular annotations having a width greater than a width of the rectangular gate shape in the gate length dimension, an offset from an edge of the active region, and a height orthogonal to the gate length dimension.

19. The system of claim 13, wherein the identified cell includes a first transistor having an active region, a gate shape over the active region, and at least one contact placed in the active region adjacent the gate shape, and wherein the shape modifications in the library for the identified cell maintain design rule spacing between the gate in the modified shape and the at least one placed contact.

20. The system of claim 13, the instructions including logic to analyze a circuit specified by the layout file, including to:
identify a circuit path in the layout file having timing slack;
select cells in the circuit path which can be modified to reduce leakage current in the circuit path; and specify gate length adjustments for transistors in the selected cells to reduce leakage current, wherein said identified cell is one of the selected cells.

21. The system of claim 13, wherein at least one of the cells in the plurality of cells includes an FET transistor, and said library includes shape modifications for a gate of the FET transistor which result in non-uniform gate lengths across the width of the channel.

22. The system of claim 13, wherein the shape modifications are constrained to fall within boundaries of the cells in the layout and to comply with design rule spacing between components of the cells, such that applying a shape modification from the library to the identified cell does not require a change in placement of the identified cell or of cells adjacent to the identified cell.

23. An article of manufacture comprising:
a non-transitory machine readable data storage medium storing a layout file, a library of shape modifications, and instructions executable by the processor;
the layout file specifying an integrated circuit design including a plurality of cells including at least one cell having a plurality of transistors, the layout file specifying shapes of components of the cells, placements of the plurality of cells, and interconnections among the cells;
the library of shape modifications for components of cells including at least one cell having a plurality of transistors, the library including data indicating adjustments of a circuit parameter of the cells which result from applying the shape modifications to the cells;
the instructions including logic to identify a cell in the layout file for adjustment of the circuit parameter; select a shape modification for the identified cell from the library of shape modifications; and apply the shape modification to the identified cell in the layout file using the selected shape modification to produce a modified layout file, the identified cell having a plurality of transistors.

24. An article of manufacture comprising:
a non-transitory machine readable data storage medium storing a modified layout file created by a method for modifying a layout file specifying an integrated circuit design including a plurality of cells, the layout file specifying shapes of components of the cells, placements of the plurality of cells, and interconnections among the cells, the method comprising:
storing a library of shape modifications for components of cells including at least one cell having a plurality of transistors, the library including data indicating adjustments of a circuit parameter of the cells which result from applying the shape modifications to the cells;
identifying a cell in the layout file for adjustment of the circuit parameter, the identified cell having a plurality of transistors;
selecting a shape modification for the identified cell from the library of shape modifications; and
applying the shape modification to the identified cell in the layout file using the selected shape modification to produce the modified layout file.

25. An integrated circuit comprising:
an integrated circuit component manufactured using a modified layout file created by a method for modifying a layout file specifying an integrated circuit design including a plurality of cells, the layout file specifying shapes of components of the cells, placements of the plurality of cells, and interconnections among the cells, the method comprising:
storing a library of shape modifications for components of cells including at least one cell having a plurality of transistors, the library including data indicating adjustments of a circuit parameter of the cells which result from applying the shape modifications to the cells;
a computer system identifying a cell in the layout file for adjustment of the circuit parameter, the identified cell having a plurality of transistors;
a computer system selecting a shape modification for the identified cell from the library of shape modifications; and
applying the shape modification to the identified cell in the layout file using the selected shape modification to produce the modified layout file.

26. An article of manufacture comprising:
a non-transitory machine readable data storage medium storing a library of shape modifications for components of cells including at least a first cell having a plurality of transistors, the cells capable of use in a layout file specifying an integrated circuit design including shapes of components of the cells, placements of the cells, and interconnections among the cells, the library including data indicating adjustments of a circuit parameter of the cells, including the first cell, which result from applying the shape modifications to the cells in a layout file, the adjustments calibrated by performing foundry process-specific optical proximity correction over combinations of the shape modifications with the cells, the shape modifications being constrained to fall within boundaries of the cells and to comply with design rule spacing between components of the cells, such that applying a shape modification from the library to a cell does not require a change in placement of the cell.

* * * * *